(12) United States Patent
Lee

(10) Patent No.: US 9,726,813 B2
(45) Date of Patent: Aug. 8, 2017

(54) LED ASSEMBLY AND LIQUID CRYSTAL DISPLAY DEVICE INCLUDING THE SAME

(71) Applicant: LG DISPLAY CO., LTD., Seoul (KR)

(72) Inventor: Jun-Ho Lee, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/952,520

(22) Filed: Nov. 25, 2015

(65) Prior Publication Data
US 2016/0154173 A1    Jun. 2, 2016

(30) Foreign Application Priority Data

Dec. 2, 2014   (KR) .......................... 10-2014-0170291

(51) Int. Cl.
| | | |
|---|---|---|
| *G02F 1/1335* | (2006.01) | |
| *F21V 8/00* | (2006.01) | |
| *H01L 33/62* | (2010.01) | |
| *H01L 33/64* | (2010.01) | |
| *H01L 27/15* | (2006.01) | |

(52) U.S. Cl.
CPC ......... *G02B 6/0085* (2013.01); *G02B 6/0073* (2013.01); *G02F 1/133603* (2013.01); *G02F 1/133615* (2013.01); *H01L 27/15* (2013.01); *H01L 33/62* (2013.01); *H01L 33/641* (2013.01); *H01L 2224/48091* (2013.01); *H01L 2224/48247* (2013.01); *H01L 2924/181* (2013.01)

(58) Field of Classification Search
CPC ................................................ G02F 1/133603
See application file for complete search history.

(56) References Cited

U.S. PATENT DOCUMENTS

| | | | |
|---|---|---|---|
| 2008/0024694 A1* | 1/2008 | Kondo | ............... G02B 6/0085 349/58 |
| 2010/0181890 A1* | 7/2010 | Tseng | ....................... F21K 9/00 313/46 |
| 2012/0262643 A1 | 10/2012 | Kweon et al. | |
| 2013/0342766 A1 | 12/2013 | Ishimoto | |

FOREIGN PATENT DOCUMENTS

WO     WO 2008/152563 A1    12/2008

* cited by examiner

*Primary Examiner* — Phu Vu
(74) *Attorney, Agent, or Firm* — Birch, Stewart, Kolasch & Birch, LLP

(57) ABSTRACT

A light emitting diode assembly according to an embodiment includes a base film having first and second surfaces opposite to each other; first and second conductive layers on the first and second surfaces of the base film, respectively; a first coverlay on the first conductive layer, the first coverlay including an open portion exposing the first conductive layer; a second coverlay on the second conductive layer, the second coverlay including a heat radiation opening; and a plurality of light emitting diodes (LEDs) on the first coverlay, the plurality of LEDs contacting the first conductive layer exposed through the open portion of the first coverlay.

16 Claims, 4 Drawing Sheets

LED ASSEMBLY AND LIQUID CRYSTAL DISPLAY DEVICE INCLUDING THE SAME

CROSS-REFERENCE TO RELATED APPLICATIONS

This application claims the priority benefit of Korean Patent Application No. 10-2014-0170291, filed on Dec. 2, 2014, which is hereby incorporated by reference for all purposes as if fully set forth herein.

BACKGROUND OF THE INVENTION

Field of the Invention

The present invention relates to a light emitting diode (LED) assembly, and more particularly, to an LED assembly having an excellent heat radiation structure and a liquid crystal display device including the LED assembly.

Discussion of the Related Art

Recently, as the information society progresses, display devices processing and displaying a large amount of information have rapidly advanced and various flat panel displays (FPDs) have been developed. Specifically, the FPDs such as liquid crystal display (LCD) devices, plasma display panel (PDP) devices, organic light emitting diode (OLED) display devices and field emission display (FED) devices, which have superior characteristics such as thin profile, light weight and low power consumption, have replaced cathode ray tubes (CRT).

Among various FPDs, LCD devices, which have various advantages of high contrast ratio, displaying moving images and low power consumption, have been used in various fields such as notebooks, monitors and televisions. LCD devices take advantage of the optical anisotropy and polarization properties of liquid crystal molecules.

An LCD device includes a liquid crystal panel having two substrates facing each other, with a liquid crystal layer between the two substrates, and obtains difference in transmittance by changing an alignment direction of the liquid crystal molecules with an electric field in the liquid crystal panel.

Since the LCD device is a non-emissive type display device, an additional light source is required for the LCD device. As a result, a backlight unit including a light source is disposed under the liquid crystal panel. For example, one of a cold cathode fluorescent lamp (CCFL), an external electrode fluorescent lamp (EEFL) and a light emitting diode (LED) may be used as the light source of a backlight unit (e.g., unit 20 in FIG. 1). Among various light sources, the LED has been widely used as the light source for its various features such as a small size, a low power consumption and a high reliability.

FIG. 1 is a cross-sectional view showing a liquid crystal display (LCD) device using a light emitting diode (LED) as a light source according to the related art.

In FIG. 1, an LCD device includes a liquid crystal panel 10, a backlight unit 20, a main frame 30, a top frame 40 and a bottom frame 50.

The liquid crystal panel 10 displaying an image includes first and second substrates 12 and 14 facing and spaced apart from each other and a liquid crystal layer interposed therebetween. Polarizing plates 19a and 19b are disposed on outer surfaces of the first and second substrates 12 and 14, respectively.

The backlight unit 20 is disposed under the liquid crystal panel 10. The backlight unit 20 includes a light source of a light emitting diode (LED) assembly 29 disposed along at least one side of the main frame 30, a reflecting plate 25 of a white color or a silver color on the bottom frame 50, a light guide plate 23 on the reflecting plate 25, and an optical sheet 21 on the light guide plate 23.

The liquid crystal panel 10 and the backlight unit 20 are surrounded by the main frame 30 of a rectangular ring shape. The top frame 40 covering a top edge portion of the liquid crystal panel 10 and the bottom frame 50 covering a rear surface of the backlight unit 20 are combined with the main frame 30 to modularize the liquid crystal panel 10 and the backlight unit 20.

The LED assembly 29 includes an LED 29a and an LED printed circuit board (PCB) 29b having the LED 29a thereon. The LED assembly 29 is fixed such that a light emitted from the LED 29a enters an incident surface of the light guide plate 23. After the light from the LED 29a enters the light guide plate 23 through the incident surface, the light is refracted toward the liquid crystal panel 10. While passing through the optical sheet 21, the light refracted in the light guide plate 23 and the light reflected by the reflecting plate 25 are processed as a surface light source having a high uniformity and a high quality to be supplied to the liquid crystal panel 10.

A temperature of the LED 29a sharply increases according to the duration of usage and the increase in temperature causes a change in lifetime and luminance. Accordingly, when the LED 29a is used as a light source of the backlight unit 20, a design of heat radiation according to the increase in the temperature of the LED 29a is one of the most important considerations.

However, since the LCD device according to the related art does not have a structure for radiating a heat of high temperature generated by the LED 29a promptly, the temperature of the LED 29a gradually increases in operation. As a result, the change in luminance causes reduction in display quality.

In addition, the lifetime of the LED 29a is reduced by increase in temperature. Specifically, the LED 29a may be formed on a flexible printed circuit board (FPCB) of an epoxy group based on a light weight, a thin profile and a flexibility of the LCD device. Since the FPCB of an epoxy group has a relatively low heat transfer coefficient, problems due to the increase in the temperature of the LED 29a are exacerbated.

SUMMARY OF THE INVENTION

Accordingly, the present invention is directed to a light emitting diode assembly and a liquid crystal display device including the same that substantially obviate one or more of the problems due to limitations and disadvantages of the related art.

An advantage of the present invention is to provide a liquid crystal display device where a heat of a light emitting diode is effectively radiated and reduction in lifetime and display quality is prevented.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a light emitting diode assembly may, for example, include a base film having first and second surfaces opposite to each other, first and second conductive layers on the first and second surfaces, respectively, a first coverlay on the first conductive layer, the first coverlay including an open portion exposing the first conductive layer, a second coverlay on the second conductive layer, the second coverlay including a heat radiation opening, and a plurality of light emitting diodes (LEDs) on the first coverlay, the plurality of LEDs contacting the first conductive layer exposed through the open portion.

In another aspect of the present invention, a liquid crystal display device may, for example, include a liquid crystal panel displaying an image, a backlight unit supplying a light to the liquid crystal panel, the backlight unit including a light guide plate under the liquid crystal panel, a light emitting diode (LED) assembly at a side of the light guide plate, a reflecting plate under the light guide plate, an optical sheet over the light guide plate, and a main frame, a top frame and a bottom frame modularizing the liquid crystal panel and the backlight unit, wherein the LED assembly includes a base film having first and second surfaces opposite to each other, first and second conductive layers on the first and second surfaces, respectively, a first coverlay on the first conductive layer, the first coverlay including an open portion exposing the first conductive layer, a second coverlay on the second conductive layer, the second coverlay including a heat radiation opening, and a plurality of light emitting diodes (LEDs) on the first coverlay, the plurality of LEDs contacting the first conductive layer exposed through the open portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1:
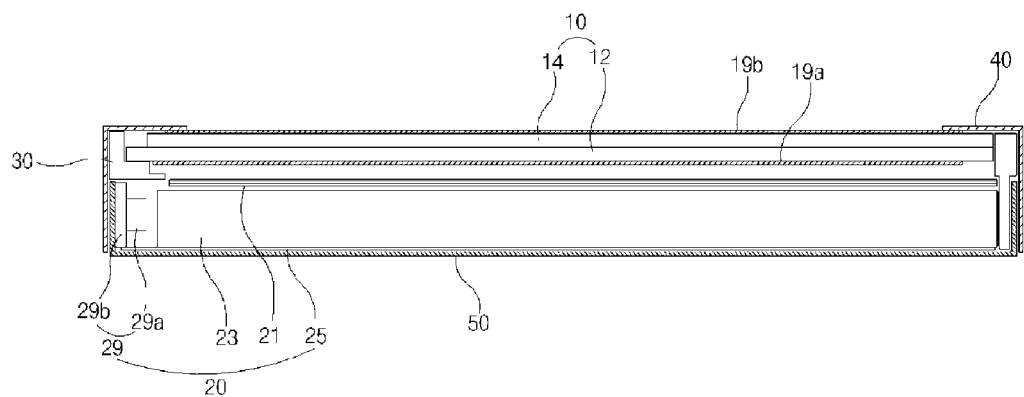
FIG. 1 is a cross-sectional view showing a liquid crystal display device using a light emitting diode as a light source according to the related art.
Figure 2:
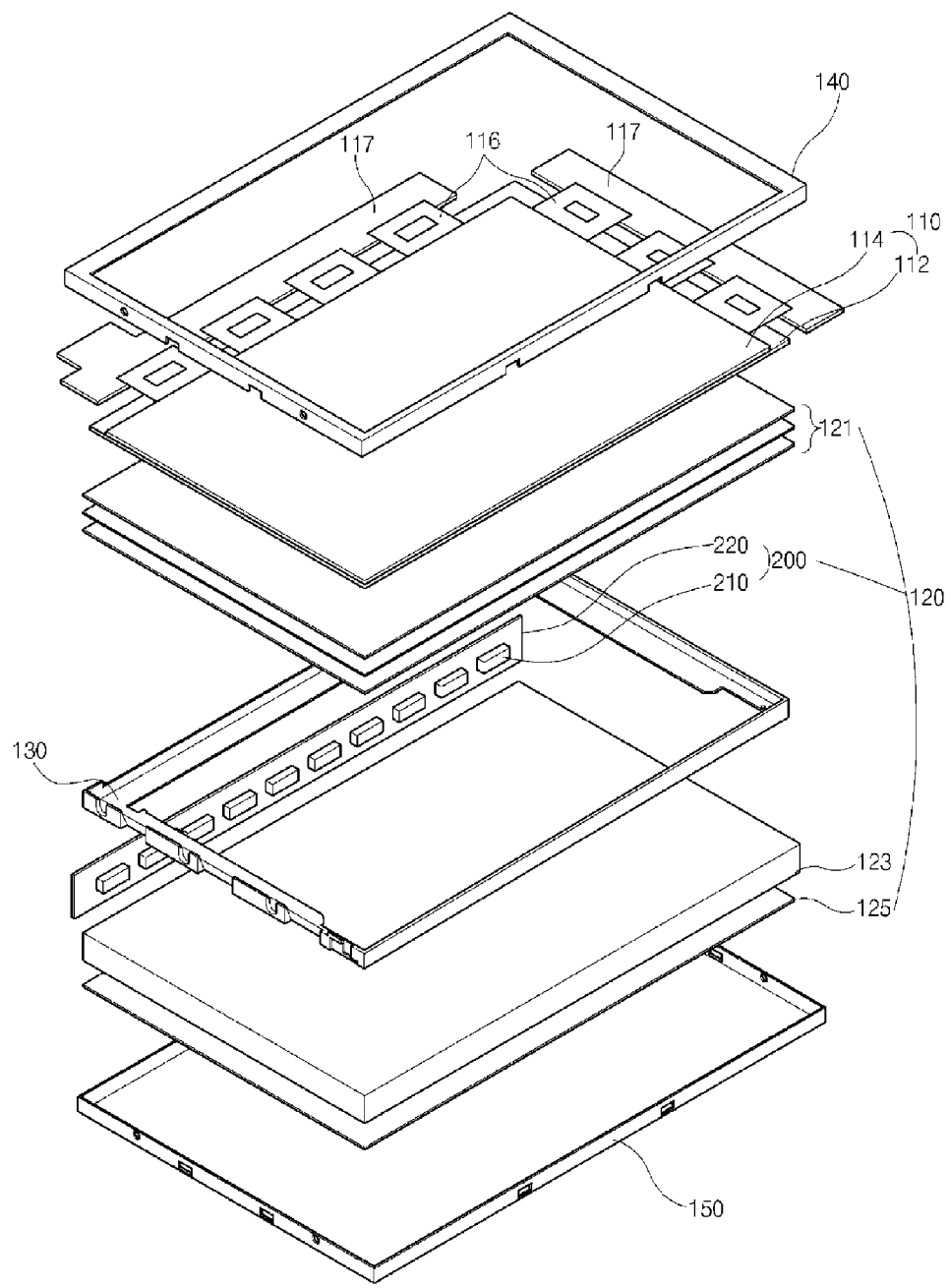
FIG. 2 is an exploded perspective view showing a liquid crystal display device according to a first embodiment of the present invention.

FIG. 2 is an exploded perspective view showing a liquid crystal display device according to a first embodiment of the present invention.

In FIG. 2, a liquid crystal display (LCD) device includes a liquid crystal panel 110, a backlight unit 120, a main frame 130, a top frame 140 and a bottom frame 150. All the components of the LCD device according to all embodiments of the present invention are operatively coupled and configured.

The liquid crystal panel 110 for displaying an image includes first and second substrates 112 and 114 facing and spaced apart from each other and a liquid crystal layer interposed between the first and second substrates 112 and 114.

When the liquid crystal panel 110 has an active matrix type, a gate line, a data line, a thin film transistor (TFT) and a pixel electrode may be formed on an inner surface of the first substrate 112 referred to as an array substrate. The gate line and the data line may cross each other to define a pixel region, and the TFT may be connected to the gate line and the data line. The pixel electrode may be connected to the TFT.

In addition, a black matrix, a color filter layer and a common electrode may be formed on an inner surface of the second substrate 114 referred to as a color filter substrate. The black matrix may cover the gate line, the data line and the TFT, and the color filter layer may include red, green and blue color filters each corresponding to the pixel region. The common electrode may be formed on the entire inner surface of the second substrate 114. Further, polarizing plates may be formed on outer surfaces of the first and second substrates 112 and 114, respectively.

A printed circuit board (PCB) 117 is connected to at least one side of the liquid crystal panel 110 through a connecting member 116 such as a flexible printed circuit (FPC) or a tape carrier package (TCP). The PCB 117 may contact a rear surface of the bottom frame 150 by folding the connecting member 116 during a modularization process.

When the TFT connected to the gate line is turned on by a gate signal of a gate driving circuit, a data signal of a data driving circuit is applied to the pixel electrode through the data line and an alignment direction of liquid crystal molecules of the liquid crystal layer is changed by an electric field generated between the pixel electrode and the common electrode. As a result, the liquid crystal panel 110 produces transmittance difference and displays images.

The backlight unit 120 for supplying a light is disposed under the liquid crystal panel 110. The backlight unit 120 includes a light emitting diode (LED) assembly 200 along at least one side of the main frame 130, a reflecting plate 125 of a white color or a silver color on the bottom frame 150, a light guide plate 123 on the reflecting plate 125 and an optical sheet 121 on the light guide plate 123.

The LED assembly 200 is disposed at a side of the light guide plate 123 to face an incident surface of the light guide plate 123, and includes a plurality of LEDs 210 and an LED flexible printed circuit board (FPCB) 220 where the plurality of LEDs 210 are disposed to be spaced apart from each other. The LED assembly 200 may be attached to a sidewall of the bottom frame 150 with a heat radiation tape.

The LCD device may include an LED driving circuit for controlling on/off of the LED assembly 200, and the LED driving circuit may be disposed to contact the rear surface of the bottom frame 150 for minimizing a total size of the LCD device. To electrically connect the plurality of LEDs 210 and the LED driving circuit, a portion of the LED FPCB 220 may extend to form an FPCB cable, and the LED assembly 200 may be connected to the LED driving circuit using flexibility of the FPCB cable.

The LED FPCB 220 of the LED assembly 200 may have a single-sided type where the plurality of LEDs 210 are formed on a single surface of the LED FPCB 220. In addition, first and second coverlays 229a and 229b (of FIG. 3A) are coated on both surfaces of the LED FPCB 220, and a heat radiation opening 230 (of FIG. 3A) is formed in the second coverlay 229b. Accordingly, a heat of high temperature generated from the plurality of LEDs 210 is promptly and effectively radiated to an exterior through the LED FPCB 220, and increase in temperature of the LCD device due to usage of the plurality of LEDs 210 is minimized. As a result, the LCD device according to the first embodiment has an excellent heat radiation structure of the LED assembly 200 due to the LED FPCB 220 including the heat radiation opening 230.

A light emitted from the plurality of LEDs 210 enters the light guide plate 123 through the incident surface, and the light is spread in the light guide plate 123 by several total reflections to provide a surface light source to the liquid crystal panel 110.

A pattern of various shapes may be formed on a rear surface of the light guide plate 123 to provide a uniform surface light source. For example, one of an elliptical pattern, a polygonal pattern and a hologram pattern may be formed on the rear surface of the light guide plate 123 by a printing method or an injection molding method.

The reflecting plate 125 is disposed under the rear surface of the light guide plate 123 and reflects the light passing through the rear surface of the light guide plate 123 toward the liquid crystal panel 110 to improve luminance of the light.

The optical sheet 121 includes a diffusing sheet and a collimating sheet and processes the light passing through the light guide plate 123 by diffusion and collimation to provide the more uniform surface light source to the liquid crystal panel 110.

The liquid crystal panel 110 and the backlight unit 120 are modularized by the main frame 130, the top frame 140 and the bottom frame 150. The top frame 140 has a rectangular ring shape having a cross-section of "L" shape to cover a side surface and an edge portion of a top surface of the liquid crystal panel 110. However, the liquid crystal panel 110 and the top frame 140 can have a different shape. The image of the liquid crystal panel 110 is displayed through an open portion of the top frame 140.

The bottom frame 150 has a rectangular plate shape having a vertically bending edge portion to accommodate the liquid crystal panel 110 and the backlight unit 120.

The main frame 130 has a rectangular ring shape to surround the side surface of the liquid crystal panel 110 and the backlight unit 120. The main frame 130 is combined with the top frame 140 and the bottom frame 150.

The main frame 130 may be referred to as a guide panel, a main support, a support main or a mold frame, the top frame 140 may be referred to as a top cover, a case top or a top case, and the bottom frame 150 may be referred to as a cover bottom, a bottom cover or a lower cover.

In the LCD device according to the first embodiment, since the second coverlay 229b coated on a rear surface of the LED FPCB 220 of the LED assembly 200 includes the heat radiation opening 230, the heat of high temperature generated from the plurality of LEDs 210 is promptly and effectively radiated to an exterior. In addition, since increase in temperature due to usage of the plurality of LEDs 210 is minimized, change in luminance and reduction in the lifetime of the plurality of LEDs 210 are prevented.

Figure 3A:
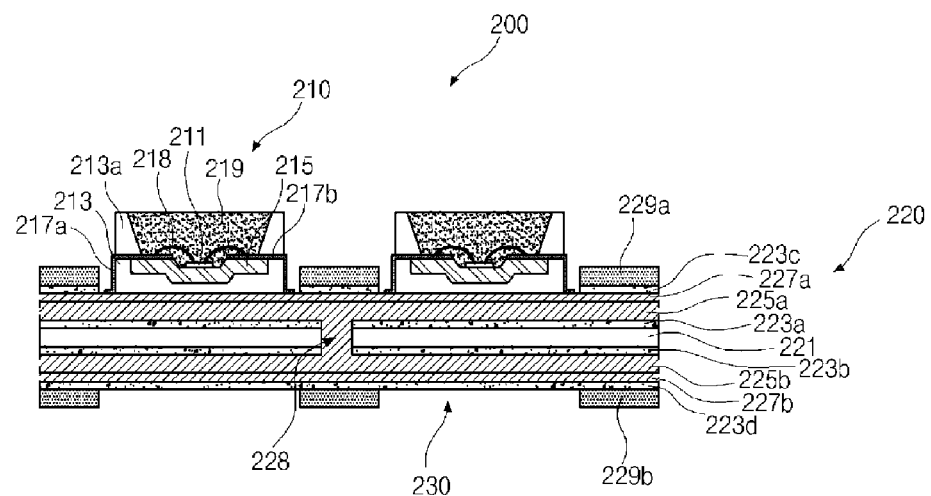
FIGS. 3A and 3B are cross-sectional view showing a light emitting diode assembly which can be used in a liquid crystal display device according to a first embodiment of the present invention.
Figure 3B:
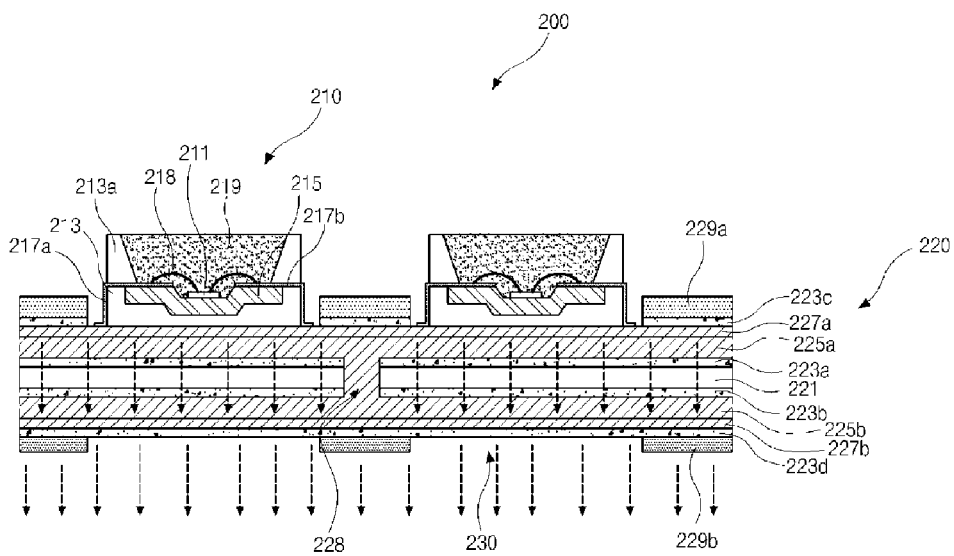

FIGS. 3A and 3B are cross-sectional view showing a light emitting diode assembly according to a first embodiment of the present invention.

In FIGS. 3A and 3B, an LED assembly 200 includes a plurality of LEDs 210 and an LED FPCB 220 where the plurality of LEDs 210 are mounted to be spaced apart from each other by a surface mount technology (SMT). The LED assembly 200 of FIGS. 3A and 3B can be used as the LED assembly 200 in FIG. 2.

Each LED 210 includes an LED chip 211, a heat slug 215 and a case 213. The LED chip 211 is disposed on the heat slug 215, and the case as a housing surrounds the heat slug 215. A pair of leads 217a and 217b electrically connected to the LED chip 211 through wires 218 are exposed outside the case 213. The pair of leads 217a and 217b may correspond to an anode and a cathode. In addition, the pair of leads 217a and 217b are electrically connected to a plurality of conductive lines on the LED FPCB 220 for light emission of the LED chip 211.

The case 213 includes a sidewall 213a vertically protruding along a side surface of the heat slug 215, and an inner surface of the sidewall 213a constitutes a reflecting surface. The sidewall 213a blocks and reflects a light horizontally emitted from the LED chip 211 forwardly.

A space surrounded by the sidewall 213a is filled with a transparent resin 219. The transparent resin 219 may be formed of a mixture of silicon and a fluorescent material. The light emitted from the LED chip 211 and the light emitted from the fluorescent material of the transparent resin 219 are mixed so that a white light can be emitted from the LED chip 211. Accordingly, the transparent resin 219 filling the inner space of the sidewall 213a protects the LED chip 211 and controls an angle of a main emitted light from the LED chip 211.

The plurality of LEDs 210 are connected in parallel or in series to the plurality of conductive lines to receive a power. The plurality of LEDs 210 may emit red, green and blue lights and a white light may be emitted from the plurality of LEDs 210 by mixture of colors. In another embodiment, each LED 210 may includes an LED chip emitting red, green and blue light to emit a white light, or each LED 210 may include an LED chip emitting a white light to emit a white light.

The plurality of LEDs 210 are spaced apart from each other on the LED FPCB 220, and the LED FPCB 220 includes a base film 221, first to fourth adhesive layers 223a to 223d, first and second conductive layers 225a and 225b, first and second plating layers 227a and 227b, and first and second coverlays 229a and 229b. The base film 221 having flexibility includes first and second surfaces opposite to each other, and the first and second adhesive layers 223a and 223b are formed on the first and second surfaces, respectively, of the base film 221. The first and second conductive layers 225a and 225b are formed on the first and second adhesive layers 223a and 223b, respectively, and the first and second plating layers 227a and 227b are formed on the first and second conductive layers 225a and 225b, respectively. The third and fourth adhesive layers 223c and 223d are formed on the first and second plating layers 227a and 227b, respectively, and the first and second coverlays 229a and 229b are formed on the third and fourth adhesive layers 223c and 223d, respectively.

The base film 221 supports the first and second conductive layers 225a and 225b and the plurality of LEDs 210. The base film 221 may be formed of a resin material such as polyimide or polyester.

The first and second conductive layers 225a and 225b may be patterned to constitute a plurality of conductive lines which are separated from each other and do not overlap each other. According to a recent request for an LCD device having a light weight, a thin profile and a high brightness, the LED FPCB 220 is required to include a lot of numbers of the plurality of conductive lines with a narrow width. As a result, the plurality of conductive lines may be formed by the first and second conductive layers 225a and 225b on the first and second surfaces of the base film 221.

The plurality of conductive lines of the first and second conductive layers 225a and 225b may be connected to each other through a via hole 228 in the base film 221 and the first and second adhesive layers 223a and 223b. The pair of leads 217a and 217b of the plurality of LEDs 210 directly contact the first plating layer 227a of the LED FPCB 220 so that a power can be supplied to the plurality of LEDs 210 through the plurality of conductive lines of the first and second conductive layers 225a and 225b.

The first coverlay 229a is attached to the first conductive layer 225a and the first plating layer 227a through the third adhesive layer 223c over the first surface of the base film 221. The first coverlay 229a may be formed on the third adhesive layer 223c by a coating method. The first coverlay 229a and the third adhesive layer 223c have an open portion exposing the first plating layer 227a, and the plurality of LEDs 210 directly contact the first plating layer 227a exposed through the open portion. Accordingly, the power is supplied to the plurality of LEDs 210 through the plurality of conductive lines of the first and second conductive layers 225a and 225b. The first coverlay 229a electrically insulates and protects the plurality of conductive lines of the first conductive layer 225a and the first plating layer 227a.

In another embodiment, the first and second plating layers 227a and 227b may be omitted, and the plurality of LEDs 210 may directly contact the first conductive layer 225a exposed through the open portion.

The second coverlay 229b is attached to the second conductive layer 225b and the second plating layer 227b through the fourth adhesive layer 223d over the second surface of the base film 221. The second coverlay 229b may be formed on the fourth adhesive layer 223d by a coating method. The second coverlay 229b has a heat radiation opening 230 exposing the fourth adhesive layer 223d. For example, the heat radiation opening 230 may correspond to the plurality of LEDs 210 such that the heat radiation opening 230 is disposed directly under the plurality of LEDs 210. The fourth adhesive layer 223d is cured to electrically insulate and protect the plurality of conductive lines of the second conductive layer 225b and the second plating layer 227b.

The heat of high temperature generated from the plurality of LEDs 210 on the first surface of the base film 221 is promptly and efficiently transferred to the second surface of the base film 221 by the heat radiation opening 230.

While the LCD device is driven, the plurality of LEDs 210 as a light source of the backlight unit (e.g., the backlight unit 120 of FIG. 2) emit a light to generate the heat of high temperature. As a result, a temperature of each LED 210 sharply increases by the heat generated from the plurality of LEDs 210 and the increase in temperature causes a reduction of lifetime and a change of luminance of each LED 210. Accordingly, when the LED 210 is used as a light source of the backlight unit 120, a design of heat radiation according to the increase in temperature of the LED 210 is one of the most important considerations.

For efficient radiation of the heat of the LED 210 to an exterior, it is preferable to radiate the heat through the LED FPCB 220 adjacent to the LED 210. However, the LED FPCB 220 includes the first and second conductive layers 225a and 225b to mount a lot of numbers of the plurality of LEDs 210 with a narrow width for providing an LCD device having a light weight, a thin profile and a high brightness. As a result, a thickness of the LED FPCB 220 increases due to the multiple layers and it is hard to efficiently radiate the heat of the plurality of LEDs 210 through the LED FPCB 220.

In the LED assembly 200 according to the first embodiment, the second coverlay 229b electrically insulating and protecting the plurality of conductive lines of the second conductive layer 225b and the second plating layer 227b on the second surface of the LED FPCB 220 includes the heat radiation opening 230 exposing the fourth adhesive layer 223d. As a result, the heat of the plurality of LEDs 210 is easily radiated to an exterior through the second surface of the LED FPCB 220.

Since a portion of the heat of the plurality of LEDs 210 is radiated from the fourth adhesive layer 223d exposed through the heat radiation opening 230 directly to the exterior without passing through the second coverlay 229b, the heat of the plurality of LEDs 210 is easily and promptly radiated to the exterior through the second surface of the LED FPCB 220.

TABLE 1 illustrates a radiation effect and an optical efficiency of LED assemblies according to the related art and the first embodiment of the present invention.

TABLE 1

| | | sample 1 (related art) | sample 2 (first embodiment) | note |
|---|---|---|---|---|
| radiation effect (temperature of central portion of LED) | after aging of room temperature (25° C.) | 72.6° C. | 68° C. | 4.6° C.↓ |
| | after aging of high temperature (70° C.) | 118.9° C. | 112.2° C. | 5.4° C.↓ |
| luminance reduction rate | after aging of room temperature (25° C.) | 10.4% | 8.1% | optical efficiency 2.3%↑ |
| | after aging of high temperature (70° C.) | 16.% | 11.1% | optical efficiency 4.9%↑ |

In TABLE 1, sample 1 is an LED assembly according to the related art where a plurality of LEDs are mounted on an LED FPCB having no heat radiation opening of a second coverlay, and sample 2 is an LED assembly according to the first embodiment of the present invention where a plurality of LEDs 210 are mounted on an LED FPCB 220 having a heat radiation opening 230 of a second coverlay 229b.

After the aging of a room temperature, the temperature of the LED assembly 200 of the sample 2 is lower than the temperature of the LED assembly of the sample 1 by about 4.6° C. In addition, after the aging of a high temperature, the temperature of the LED assembly 200 of the sample 2 is lower than the temperature of the LED assembly of the sample 1 by about 5.4° C.

Specifically, the temperature of the sample 2 becomes lower than the temperature of the sample 2 by about 10° C. through the aging of a high temperature after the aging of a room temperature. As a result, the LED assembly 200 of the sample 2 has a more efficient design of heat radiation as compared with the LED assembly of the sample 1.

Since the LED assembly 200 has an efficient design of heat radiation, an optical efficiency of the LED assembly 200 is also improved. After the aging of a room temperature, a luminance reduction rate of the LED assembly 200 of the sample 2 is about 8.1%, while a luminance reduction rate of the LED assembly of the sample 1 is about 10.4%. As a result, an optical efficiency of the LED assembly 200 of the sample 2 is improved by about 2.3% as compared with an optical efficiency of the LED assembly of the sample 1.

In addition, after the aging of a high temperature, an optical efficiency of the LED assembly 200 of the sample 2 is improved by about 4.9% as compared with an optical efficiency of the LED assembly of the sample 1. Specifically, an optical efficiency of the LED assembly 200 of the sample 2 is improved by about 7.2% as compared with an optical efficiency of the LED assembly of the sample 1 through the aging of a high temperature after the aging of a room temperature.

In the LCD device according to the first embodiment of the present invention, since the second coverlay 229b over the second surface of the LED FPCB 220 of the LED assembly 200 of the backlight unit 120 has the heat radiation opening 230 exposing the fourth adhesive layer 223d, the heat of the plurality of LEDs 210 is efficiently and promptly radiated to the exterior. As a result, increase in temperature of the plurality of LEDs 210 is minimized, and change in luminance and reduction in lifetime of the plurality of LEDs 210 are prevented. In addition, the optical efficiency of the LED assembly 200 is improved.

Figure 4A:
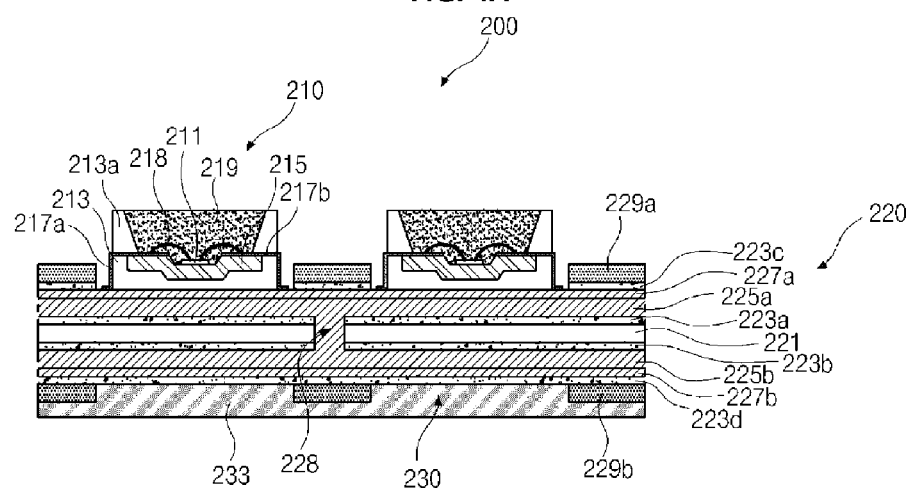
FIGS. 4A and 4B are cross-sectional view showing a light emitting diode assembly which can be used in a liquid crystal display device according to a second embodiment of the present invention.
Figure 4B:
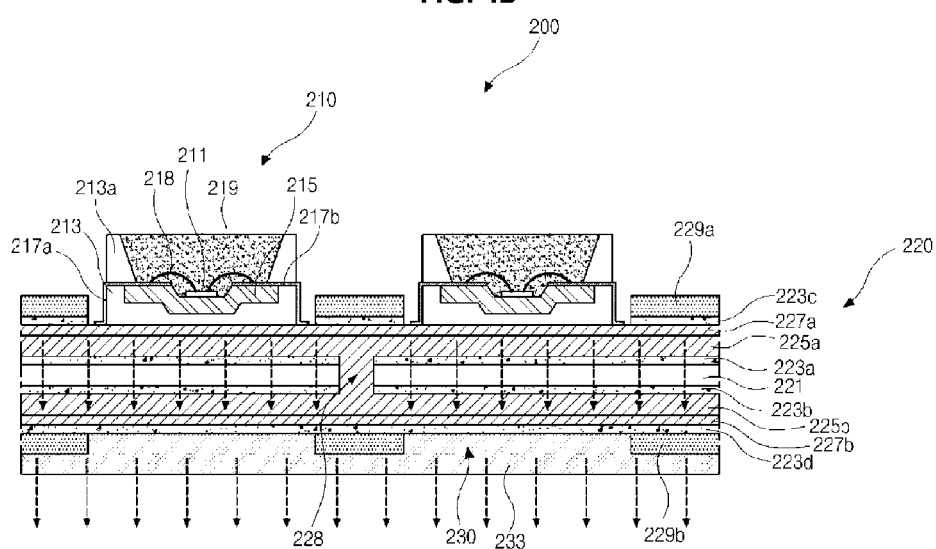

FIGS. 4A and 4B are cross-sectional view showing a light emitting diode assembly according to a second embodiment of the present invention. The parts having the same structure and the same function as the parts of the first embodiment preferably have the same reference numbers.

In FIGS. 4A and 4B, an LED assembly 200 includes a plurality of LEDs 210 and an LED FPCB 220 where the plurality of LEDs 210 are mounted to be spaced apart from each other by a surface mount technology (SMT). The LED assembly 200 of FIGS. 4A and 4B can be used as the LED assembly 200 in FIG. 2.

Each LED 210 includes an LED chip 211, a heat slug 215 and a case 213. The LED chip 211 is disposed on the heat slug 215, and the case as a housing surrounds the heat slug 215. A pair of leads 217a and 217b electrically connected to the LED chip 211 through wires 218 are exposed outside the case 213. The pair of leads 217a and 217b may correspond to an anode and a cathode. In addition, the pair of leads 217a and 217b are electrically connected to a plurality of conductive lines (not shown) on the LED FPCB 220 for light emission of the LED chip 211.

The case 213 includes a sidewall 213a vertically protruding along a side surface of the heat slug 215, and an inner surface of the sidewall 213a constitutes a reflecting surface. The sidewall 213a blocks and reflects a light horizontally emitted from the LED chip 211 forwardly. A space surrounded by the sidewall 213a is filled with a transparent resin 219. The transparent resin 219 may be formed of a mixture of silicon and a fluorescent material.

The plurality of LEDs 210 are spaced apart from each other on the LED FPCB 220, and the LED FPCB 220 includes a base film 221, first to fourth adhesive layers 223a to 223d, first and second conductive layers 225a and 225b, first and second plating layers 227a and 227b, first and second coverlays 229a and 229b, and a heat radiation layer 233. The base film 221 having flexibility includes first and second surfaces opposite to each other, and the first and second adhesive layers 223a and 223b are formed on the first and second surfaces, respectively, of the base film 221. The first and second conductive layers 225a and 225b are formed on the first and second adhesive layers 223a and 223b, respectively, and the first and second plating layers 227a and 227b are formed on the first and second conductive layers 225a and 225b, respectively. The third and fourth adhesive layers 223c and 223d are formed on the first and second plating layers 227a and 227b, respectively, and the first and second coverlays 229a and 229b are formed on the third and fourth adhesive layers 223c and 223d, respectively.

The base film 221 supports the first and second conductive layers 225a and 225b and the plurality of LEDs 210. The base film 221 may be formed of a resin material such as polyimide or polyester.

The first and second conductive layers 225a and 225b may be patterned to constitute a plurality of conductive lines which are separated from each other and do not overlap each other. The plurality of conductive lines of the first and second conductive layers 225a and 225b may be connected to each other through a via hole 228 in the base film 221 and the first and second adhesive layers 223a and 223b. The pair of leads 217a and 217b of the plurality of LEDs 210 directly contact the first plating layer 227a of the LED FPCB 220 so that a power can be supplied to the plurality of LEDs 210 through the plurality of conductive lines of the first and second conductive layers 225a and 225b.

The first coverlay 229a is attached to the first conductive layer 225a and the first plating layer 227a through the third adhesive layer 223c over the first surface of the base film 221. The first coverlay 229a may be formed on the third adhesive layer 223c by a coating method. The first coverlay 229a and the third adhesive layer 223c have an open portion exposing the first plating layer 227a, and the plurality of LEDs 210 directly contact the first plating layer 227a exposed through the open portion. Accordingly, the power is supplied to the plurality of LEDs 210 through the plurality of conductive lines of the first and second conductive layers 225a and 225b. The first coverlay 229a electrically insulates and protects the plurality of conductive lines of the first conductive layer 225a and the first plating layer 227a.

The second coverlay 229b is attached to the second conductive layer 225b and the second plating layer 227b through the fourth adhesive layer 223d over the second surface of the base film 221. The second coverlay 229b may be formed on the fourth adhesive layer 223d by a coating method. The second coverlay 229b has a heat radiation opening 230 exposing the fourth adhesive layer 223d. The fourth adhesive layer 223d is cured to electrically insulate and protect the plurality of conductive lines of the second conductive layer 225b and the second plating layer 227b.

The heat radiation layer 233 is formed on the second coverlay 229b to directly contact the fourth adhesive layer 223d exposed through the heat radiation opening 230. The heat transfer from the fourth adhesive layer 223d to the heat radiation tape on the bottom frame 150 (of FIG. 2) may be improved by the heat radiation layer 233 filling the heat radiation opening 230 of the second coverlay 229b.

The heat radiation layer 233 may include one of aluminum (Al), copper (Cu), zinc (Zn), silver (Ag), gold (Au), iron (Fe) and an alloy thereof. For example, the heat radiation layer 233 may be formed of aluminum (Al) having a high heat conductivity, a light weight and a low price. The heat radiation layer 233 may be formed of aluminum (Al) having a purity of about 99.5%, and a black aluminum oxide layer may be formed on an aluminum (Al) layer by an anodizing treatment for increasing a heat absorption rate. In addition, the heat radiation layer 233 may be formed of electrolytic galvanized iron (EGI), or the heat radiation layer 233 may be formed of graphite. Alternatively, the heat radiation layer 233 may be formed of a resin composition including an epoxy and a heat conductive filler having at least one of aluminum (Al), graphite and copper (Cu).

The heat of high temperature generated from the plurality of LEDs 210 on the first surface of the base film 221 is promptly and efficiently transferred to the second surface of the base film 221 by the heat radiation opening 230 and the heat radiation layer 233.

In the LED assembly 200 according to the second embodiment, the second coverlay 229b electrically insulating and protecting the plurality of conductive lines of the second conductive layer 225b and the second plating layer 227b on the second surface of the LED FPCB 220 includes the heat radiation opening 230 exposing the fourth adhesive layer 223d, and the heat radiation layer 233 is formed on the second coverlay 229b to contact the fourth adhesive layer 223d. As a result, the heat of the plurality of LEDs 210 is easily radiated to an exterior through the second surface of the LED FPCB 220.

Since a portion of the heat of the plurality of LEDs 210 is radiated from the fourth adhesive layer 223d exposed through the heat radiation opening 230 to the exterior through the heat radiation layer 233 without passing through the second coverlay 229b, the heat of the plurality of LEDs 210 is easily and promptly radiated to the exterior through the second surface of the LED FPCB 220.

In the LCD device according to the second embodiment of the present invention, since the second coverlay 229b over the second surface of the LED FPCB 220 of the LED assembly 200 of the backlight unit 120 has the heat radiation opening 230 exposing the fourth adhesive layer 223d and the heat radiation layer 233 is formed on the second coverlay 229b to contact the fourth adhesive layer 223d, the heat of the plurality of LEDs 210 is efficiently and promptly radiated to the exterior. As a result, increase in temperature of the plurality of LEDs 210 is minimized, and change in luminance and reduction in lifetime of the plurality of LEDs 210 are prevented. In addition, the optical efficiency of the LED assembly 200 is improved.

The heat radiation opening 230 in the second coverlay 229b according to the first and second embodiments may have a shape of one of a circle, a rectangle and polygon to expose the fourth adhesive layer 223d.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode assembly comprising:
a base film having first and second surfaces opposite to each other;
first and second conductive layers on the first and second surfaces of the base film, respectively;
a first coverlay on the first conductive layer, the first coverlay including an open portion exposing the first conductive layer;
a second coverlay on the second conductive layer, the second coverlay including a heat radiation opening; and
a plurality of light emitting diodes (LEDs) on the first coverlay, the plurality of LEDs contacting the first conductive layer exposed through the open portion of the first coverlay,
wherein the heat radiation opening of the second coverlay corresponds to the plurality of LEDs.

2. The light emitting diode assembly of claim 1, further comprising:
a first adhesive layer between the first surface and the first conductive layer;
a second adhesive layer between the second surface and the second conductive layer;
a first plating layer on the first conductive layer;
a third adhesive layer on the first plating layer;
a second plating layer on the second conductive layer; and
a fourth adhesive layer on the second plating layer.

3. The light emitting diode assembly of claim 2, wherein the heat radiation opening of the second coverlay exposes the fourth adhesive layer.

4. The light emitting diode assembly of claim 2, wherein the fourth adhesive layer exposed through the heat radiation opening of the second coverlay is cured to insulate and protect the second conductive layer and the second plating layer.

5. A light emitting diode assembly comprising:
a base film having first and second surfaces opposite to each other;
first and second conductive layers on the first and second surfaces of the base film, respectively;
a first coverlay on the first conductive layer, the first coverlay including an open portion exposing the first conductive layer;
a second coverlay on the second conductive layer, the second coverlay including a heat radiation opening;
a plurality of light emitting diodes (LEDs) on the first coverlay, the plurality of LEDs contacting the first conductive layer exposed through the open portion of the first coverlay; and
a heat radiation layer on the second coverlay.

6. The light emitting diode assembly of claim 5, wherein the heat radiation layer includes one of aluminum (Al), copper (Cu), zinc (Zn), silver (Ag), gold (Au), iron (Fe) and an alloy thereof.

7. The light emitting diode assembly of claim 5, wherein the heat radiation layer includes an aluminum (Al) layer having a purity of about 99.5% and a black aluminum oxide layer on the aluminum (Al) layer by an anodizing treatment.

8. The light emitting diode assembly of claim 5, wherein the heat radiation layer includes graphite.

9. The light emitting diode assembly of claim 5, wherein the heat radiation layer includes a resin composition having an epoxy and a heat conductive filler of at least one of aluminum (Al), graphite and copper (Cu).

10. A liquid crystal display device comprising:
a liquid crystal panel displaying an image;
a backlight unit supplying a light to the liquid crystal panel, the backlight unit including
a light guide plate under the liquid crystal panel,
a light emitting diode (LED) assembly at a side of the light guide plate,
a reflecting plate under the light guide plate, and
an optical sheet over the light guide plate; and
a main frame, a top frame and a bottom frame modularizing the liquid crystal panel and the backlight unit,
wherein the LED assembly comprises:

a base film having first and second surfaces opposite to each other;

first and second conductive layers on the first and second surfaces of the base film, respectively;

a first coverlay on the first conductive layer, the first coverlay including an open portion exposing the first conductive layer;

a second coverlay on the second conductive layer, the second coverlay including a heat radiation opening; and a plurality of light emitting diodes (LEDs) on the first coverlay, the plurality of LEDs contacting the first conductive layer exposed through the open portion of the first coverlay.

11. The liquid crystal display device of claim 10, wherein the LED assembly further comprises:

a first adhesive layer between the first surface and the first conductive layer;

a second adhesive layer between the second surface and the second conductive layer;

a first plating layer on the first conductive layer;

a third adhesive layer on the first plating layer;

a second plating layer on the second conductive layer; and a fourth adhesive layer on the second plating layer.

12. The liquid crystal display device of claim 11, wherein the LED assembly is attached to a sidewall of the bottom frame with a heat radiation tape such that the heat radiation tape is disposed between the fourth adhesive layer exposed through the heat radiation opening and the sidewall.

13. The liquid crystal display device of claim 11, wherein the LED assembly further comprises a heat radiation layer on the second coverlay to fill the heat radiation opening of the second coverlay.

14. The liquid crystal display device of claim 13, wherein the heat radiation layer includes one of aluminum (Al), copper (Cu), zinc (Zn), silver (Ag), gold (Au), iron (Fe) and an alloy thereof.

15. The liquid crystal display device of claim 13, wherein the heat radiation layer includes an aluminum (Al) layer having a purity of about 99.5% and a black aluminum oxide layer on the aluminum (Al) layer by an anodizing treatment.

16. The liquid crystal display device of claim 13, wherein the heat radiation layer includes a resin composition having an epoxy and a heat conductive filler of at least one of aluminum (Al), graphite and copper (Cu).

* * * * *